(12) United States Patent
Reilly et al.

(10) Patent No.: US 10,877,841 B1
(45) Date of Patent: Dec. 29, 2020

(54) TOPOLOGICAL QUANTUM ERROR CORRECTION USING A DATA BUS

(71) Applicant: Turing Inc., Los Angeles, CA (US)

(72) Inventors: Michele Reilly, Los Angeles, CA (US); Simon Devitt, Sydney (AU)

(73) Assignee: Turing Inc., Los Angeles, CA (US)

( * ) Notice: Subject to any disclaimer, the term of this patent is extended or adjusted under 35 U.S.C. 154(b) by 0 days.

(21) Appl. No.: 16/451,713

(22) Filed: Jun. 25, 2019

(30) Foreign Application Priority Data

Jun. 21, 2019 (EP) .................................... 19181735

(51) Int. Cl.
| | |
|---|---|
| *G06F 11/10* | (2006.01) |
| *G06N 10/00* | (2019.01) |
| *G11C 29/52* | (2006.01) |
| *G06F 13/40* | (2006.01) |

(52) U.S. Cl.
CPC ...... *G06F 11/1068* (2013.01); *G06F 13/4027* (2013.01); *G06N 10/00* (2019.01); *G11C 29/52* (2013.01)

(58) Field of Classification Search
CPC . G06F 11/1068; G06F 13/4027; G06N 10/00; G11C 29/52
See application file for complete search history.

(56) References Cited

U.S. PATENT DOCUMENTS

| | | | |
|---|---|---|---|
| 10,255,555 B2 * | 4/2019 | Curtis ................. | G06F 16/9024 |
| 10,352,992 B1 * | 7/2019 | Zeng ..................... | G06N 10/00 |
| 2005/0262179 A1 | 11/2005 | Tucci | |
| 2008/0258049 A1 | 10/2008 | Kuzmich et al. | |
| 2011/0133770 A1 | 6/2011 | Przybysz et al. | |
| 2016/0344414 A1 | 11/2016 | Naaman et al. | |
| 2018/0285761 A1 * | 10/2018 | Gambetta ............ | H03M 13/01 |
| 2019/0044542 A1 * | 2/2019 | Hogaboam .......... | G06N 3/0635 |
| 2019/0065299 A1 | 2/2019 | Lee et al. | |
| 2020/0242208 A1 * | 7/2020 | Daraeizadeh ......... | G06N 10/00 |

OTHER PUBLICATIONS

Devitt, Simon J, William J Munro, and Kae Nemoto. "Quantum Error Correction for Beginners." Reports on Progress in Physics 76.7 (2013): 076001. Crossref. Web. (Year: 2013).*

A. Shafaei, M. Saeedi and M. Pedram, "Optimization of quantum circuits for interaction distance in linear nearest neighbor architectures," 2013 50th ACM/EDAC/IEEE Design Automation Conference (DAC), Austin, TX, 2013, pp. 1-6 (Year: 2013).*

(Continued)

*Primary Examiner* — Cynthia Britt
(74) *Attorney, Agent, or Firm* — Proskauer Rose LLP

(57) ABSTRACT

Described herein is a Quantum Computing device comprising a first and a second square patch of qubits, each of the first and second square patch of qubits representing a logical qubit and being in a joint quantum state corresponding to a surface code, the surface code having a distance of two or more. The first and second square patch of qubits have a side-length equal to the distance plus one qubits. The device furthermore comprises one or more chain of qubits prepared in a joint GHZ state serving as a data bus. The chain of qubits neighbors both the first and the second square patch of qubits and has a length equal to or greater than the sum of the two side-lengths.

15 Claims, 2 Drawing Sheets

(56) References Cited

OTHER PUBLICATIONS

Fowler, Austin G., Charles D. Hill, and Lloyd C. L. Hollenberg. "Quantum-Error Correction on Linear-Nearest-Neighbor Qubit Arrays." Physical Review A 69.4 (2004): n. pag. Crossref. Web. (Year: 2004).*

Demonstration of a quantum error detection code using a square lattice of four superconducting qubits A.D. Córcoles, Easwar Magesan, Srikanth J. Srinivasan, Andrew W. Cross, M. Steffen, Jay M. Gambetta & Jerry M. Chow Nature Communications vol. 6, Article No. 6979 (2015) (Year: 2015).*

S. Varsamopoulos, K. Bertels and C. G. Almudever, "Comparing Neural Network Based Decoders for the Surface Code," in IEEE Transactions on Computers, vol. 69, No. 2, pp. 300-311, Feb. 1, 2020. (Year: 2020).*

Herr, Daniel et al., "Time versus Hardware: Reducing Qubit Counts with a (Surface Code) Data Bus," arXiv:1902.08117, Feb. 21, 2019, available at https://arxiv.org/abs/1902.08117, 23 pages.

Devitt, Simon J. et al., "High-speed quantum networking by ship," Scientific Reports 6:36163 (DOI: 10.1038/srep36163), pp. 1-7 (2016).

* cited by examiner

STABILIZER TABLE

D = Data Qubit
X = X-operator
Z = Z-operation

D = Data Qubit
S = Syndrome Qubit
H = Hadamard gate

TOPOLOGICAL QUANTUM ERROR CORRECTION USING A DATA BUS

RELATED APPLICATIONS

This application claims priority to European Patent Application No. 19181735.2, filed on Jun. 21, 2019, the entirety of which is incorporated herein by reference.

TECHNICAL FIELD

Embodiments of the present disclosure relate to methods and devices for performing fault-tolerant and error corrected quantum computing, in particular, topological quantum computing based on the planar- or surface code.

BACKGROUND

Quantum computing involves operations on qubits, which, unlike conventional bits that can only be either in the state '0' or '1', may be in any quantum mechanical superposition of these two states. By thus allowing to effectively operate on a large number of inputs simultaneously, certain quantum algorithms, most notably Shor's Algorithm for factoring large numbers, achieve an up to exponentially large speedup over classical algorithms.

However, due to the non-discrete nature of the information represented by a qubit, it is much more susceptible to errors than a classical bit. Therefore useful quantum algorithms are reliant on error correction, where a logical qubit are encoded into two distinct subspaces of the joint Hilbert space of several physical qubits. Since current quantum computing devices contain still a comparatively small number of qubits, they do not have the required capacity to implement useful algorithms with a sufficient degree of fault tolerant error-correction.

One promising paradigm for achieving general quantum computation is Topological Quantum Error Correction. Schemes according to this paradigm store single logical qubits in a lattice of physical qubits in a topologically non-trivial joint quantum state, and use quantum measurement and purely classical error correction to preserve the logical qubits in the face of experimental conditions. This permits logical qubits to be preserved for substantially longer than the typical coherence time of the physical qubits.

In Topological Quantum Error Correction, operations on logical qubits are implemented by topologically non-trivial operations on the underlying physical qubits. Since errors are mostly caused by local processes, i.e. processes affecting only one or a small number of physical qubits but not the majority or all of them at once, error protection in Topological Quantum Error Correction schemes arise from the properties of the topological states used to encode the logical qubits. These topological states can only be affected by global changes but not by merely local ones.

One implementation of topological quantum error correction is based on surface codes, which evolved from an idea by Alexei Kitaev known as toric codes. The latter were invented as simple models for topologically ordered quantum states and comprised qubits distributed on the surface of a toroid. The toroidal geometry/topology turned out to be unnecessary and planar versions, the planar or surface codes, also showing topologically non-trivial behavior were developed by Kitaev and others.

In the surface code, logical qubits are represented by square patches of $(d+1) \times (d+1)$ qubits, with d called the distance of the surface code. A part of these qubits are classified as data qubits and the rest as syndrome qubits, each class arranged in a square lattice forming a sub-lattice of the square patch. The qubits of the patch are prepared in a topologically non-trivial joint quantum state and kept corrected against errors by stabilizer measurements on the syndrome qubits, where a stabilizer corresponds to a product operators on the joint Hilbert space of all the syndrome qubits in a patch.

The parameter d is the distance of that implementation of the surface code and is a measure for the level of error correction. If more protection from errors is required or desired, one may simply increase the distance of the code, i.e. the size of the surface code patches. This obviates the need for nested error correction, where the qubits used in forming a logical qubit are themselves logical qubits. This is in principle also possible for the surface code, but is more cumbersome and less efficient than simply increasing the distance of the code. Therefore, when in the following reference is made to the qubits of a surface code patch this should be understood to refer to physical qubits, unless otherwise stated.

In contrast to standard, non-topological error corrected quantum computing schemes, the theoretical error thresholds, i.e. the maximum permissible probability of an error occurring in a physical qubit such that error correction leads to a reduction in the error probability of the logical qubits, of topological quantum error correction schemes are significantly higher, for instance around 1% in case of the surface codes.

However, a downside of Topological Quantum Error Correction is the large overhead in logical ancilla qubits, usually prepared in some special quantum state, required to perform both single and multi-qubit operations. Thus, while compared to non-topological schemes employing nested layers of error correction much fewer physical qubits are required per top-level logical qubit to achieve a certain desired level of error per (top-level) logical qubit, this need for ancilla qubits drives up the number of both physical qubits required and also creates an operational overhead in having to continually prepare a, potentially large, number of ancilla qubits in a certain quantum state.

To allow useful quantum computation as early as possible, algorithms need to be optimized such that less logical qubits are required. Fault tolerant computation protocols need to be optimized such that the overhead of physical qubits is reduced.

Such an optimization for the surface code as the underlying error correction protocol and lattice surgery as a means of computation was put forward in a recent proposal by Daniel Litinski in "A game of surface codes: Large-scale quantum computing with lattice surgery," available at https://arxiv.org/abs/1808.02892. It reduces the overhead in time and physical qubits by moving to lattice surgery based methods of computation. In particular, it achieves an order of magnitude improvement in the number of physical qubits required to enact a certain set of logic gates over braid-based techniques with the introduction of multi-qubit measurements.

A remaining disadvantage is however, that the measurements used in this proposal require all-to-all connectivity between logical qubits and therefore patches of logical ancilla qubits need to be introduced for their protocol, leading to a spatial overhead of additional physical qubits, that are not strictly a part of the error-corrected computation.

SUMMARY

It is therefore an object of the present invention to find a quantum computing device and a method for performing quantum computing, that achieves the all-to-all connectivity between qubits necessary for performing lattice surgery with a smaller number of logical ancilla qubits, thereby reducing the spatial overhead in qubits.

In a first aspect of the invention, this object is achieved in a device for performing quantum computing comprising a first square patch of $(d+1)\times(d+1)$ qubits and a second square patch of $(d+1)\times(d+1)$ qubits, both in a joint quantum state corresponding to a surface code with distance $d>=2$, in the following also referred to as the first and second surface code patch respectively, wherein each patch encodes a logical qubit. The first and second surface code patch are connected by a patch of $N\times m$ physical qubits in a joint quantum state serving as a data bus. The connection is made possible in that n1 qubits of the data bus patch are each adjacent to a qubit of the first surface code patch and n2 qubits of the chain are each adjacent to a qubit of the second surface code patch, where $0<n1, n2<N$. The sum of n1 and n2 has to be smaller or equal to N and the width m of the data bus qubit patch, or simply data bus, has to be at least one qubit, i.e. $m>=1$, but is less than the 'width' of a surface code patch, i.e. $m=<d$.

In some embodiments of the invention, "adjacent" may simply refer to the capability of the quantum computing device of the invention to perform two qubit operations between two or more qubits, even if these qubits are physically remote from each other. In some embodiments of the invention, "adjacent" implies that the qubits of the device are in fact physically adjacent to each other. For instance, in embodiments of the quantum computing device of the invention, where qubits are arranged in a square lattice, "adjacent" refers to pairs of nearest neighbor qubits.

In some embodiments three or more logical qubits in the form of surface code patches are used. All surface code patches are effectively connected through one or more data buses. In some embodiments there is only a single qubit patch serving as a data bus. In other embodiments there is more than one qubit patch serving as data bus.

The data bus patches may be of the same or different lengths and of the same or different width.

The joint quantum state qubits of the data bus may be a topological quantum state such as a surface code state. There may be a distinction between data qubits and syndrome qubits and the joint quantum state of the data bus qubits is error corrected in a similar way as that of the surface code patches encoding the logical qubits of the device, i.e. by (repeated) stabilizer measurement of the syndrome qubits.

A data bus connects two surface code patches if for each patch there is at least one qubit in the data bus adjacent to it. In some embodiments the patch of qubits serving as data bus connects only two of the surface code patches of the quantum computing device. In other embodiments it connects more than two, in particular all of the surface code patches.

In some embodiments, there is a chain of qubits serving as data bus, i.e. a patch of qubits with a width of $m=1$. In some embodiments, all data bus qubit patches are chains of qubits having a width of 1.

In some embodiments there are four or more surface code patches as logical qubits, in particular $K\times L$ surface code patches, arranged in a rectangular array. In some of these embodiments, there are data bus patches of qubits, preferably chains of qubits, connecting all surface code patches in one row, preferably in all rows of the rectangular array. Alternatively or additionally, in some embodiments there are data bus patches, preferably chains, connecting all surface code patches in one column, preferably in all columns of the rectangular array.

In preferred embodiments, the quantum computing device of the invention consists of a rectangular array of $(K(d+m+1)-m)\times(L(d+m+1)-m)$ physical qubits containing $K\times L$ logical qubits encoded by square surface code patches with distance d and thus each containing $(d+1)\times(d+1)$ qubits, separated from each other by rectangular patches of qubits serving as data busses of width m, where there are K−1 horizontal data bus patches of $(L(d+m+1)-m))\times m$ qubits each and L−1 vertical data bus patches of $(K(d+m+1)-m))\times m$ qubits each.

In another aspect of the invention, a method for performing a merge operation during lattice surgery based quantum computing is disclosed. Given a first and second logical qubit, each in the form of a surface code patch with distance d, in a first step a set of N qubits are prepared in a GHZ state, the set of N qubits being adjacent to both surface code patches. During a following second step, transversal CNOT operations are performed between the qubits of pairs of adjacent qubits where one member of each pair belongs to the first or second square patch and the other to the set of N qubits. During a following third step, all N qubits are measured in the x-Basis. In a fourth step, steps one through three are repeated a certain number of times. In a fifth and last step, an error-corrected measurement result is obtained by taking a majority vote over the individual measurement results of step four. In some embodiments, the set of N qubits is arranged as a physical chain of adjacent qubits.

In some embodiments, the GHZ state is corrected against bit-flip errors, preferably by performing d cycles of error correction comprising syndrome extraction.

In some embodiments, the fourth step involves at least d repetitions, preferably exactly d repetitions.

In some embodiments of the quantum computing device or the quantum computing method according to this invention the distance d of the surface code is $d=2$. In other embodiments the distance d is larger than 2, in particular, 3, 4, 5, 10, 20, 30 or 40.

The basic idea underlying the invention is to achieve the object of reducing the space overhead for the ancillas needed to provide all-to-all connectivity between qubits by introducing a small data-bus between the planar code patches encoding a logical qubit.

This is done using rectangular patches of $N\times m$ physical qubits, as a data bus, with $m<d$. The qubits in the patches are prepared in a certain error-corrected joint quantum state. For instance, in some embodiments chains, i.e. rectangular patches with $m=1$, of physical qubits may be used as data bus connecting the patches of logical qubits. To perform a parity check between logical qubits connected by such a chain, the N qubits of the chain may be prepared in a GHZ state.

The data bus of this invention is thus a single long-range stabilizer that acts on logical qubit states. Unlike surface-code stabilizers which are regularly measured during syndrome extraction, this logical stabilizer is only enforced once when logical information has to be manipulated, i.e. when lattice surgery merge or split operations have to be performed. Similarly to stabilizers it does only encode a single classical bit of information. This classical bit of information does not require the full error correction that a logical qubit needs. Instead, it can be encoded using simpler error correction methods such as the repetition code. This approach is completely consistent with the surface code and can be implemented on any architecture that supports the surface code.

The use of a rectangular patch of qubits as data bus between surface code patches has several advantages over the use of ancilla patches. Mainly, it allows arbitrary connectivity of different surface code patches without any movement and the overhead in terms of ancilla qubits is reduced. Additionally, Y-state measurements and parity checks are supported without any additional overhead during the computation. In the non-rotated layout of the planar code the qubits that are required during merge operations can be used to make up the data bus. The reduction in ancilla qubits does not come at the cost of adding additional qubits in this case. Rotated patches are supported by the data bus as well. However, a single layer of physical qubits is needed between neighboring patches.

This data bus architecture is also beneficial for communication between different quantum computers. It allows interfaces between different fault-tolerant architectures. Lattice surgery between various codes has recently been shown to be possible by Nautrup et al. (as described in "Fault-tolerant interface between quantum memories and quantum processors," Nature Communications 8, Article number 1321 (2017), which is incorporated herein by reference) and their methods can be extended to arbitrary connectivity using the data bus of this invention.

However, there is still a trade-off to be made: While the scheme underlying the invention reduces the overhead for all ancilla patches and thus physical qubits, the time to execute a multi-qubit measurement takes longer depending on the distance of the surface code. This trade-off seems to be beneficial in most of the cases, especially for early fault-tolerant computations where algorithms are unlikely to be deep and the distances are short.

Due to the longer time taken for a computation, more error correction is required for a given coherence time of the qubits and desired confidence in the result, partially cancelling the gains achieved by the invention. Each preparation of the data bus requires d rounds of stabilizer measurements. The whole procedure needs to be repeated for d times resulting in a total time overhead of d2. A merge operation only requires d rounds of error correction. With the inclusion of this time overhead the distance needs to be adjusted. We found that for executing distillation protocols the data bus of the invention is still beneficial in terms of total qubits for distances up to d=40. Even better performance can be expected for hybrid models, where nearest neighbor merges are performed traditionally and the data bus is used for the rest.

All commercially viable quantum algorithms have to be fault-tolerant. Fault-tolerance comes at a resource cost: This cost takes the form of overhead in both time and qubit count. In order to perform error corrected, fault tolerant quantum machines, the quantum industry requires several orders of magnitude in additional qubits than what exists on quantum cloud platforms today.

The scalability of Noisy Intermediate Scale Quantum (NISQ) computers poses great challenges for fault-tolerant computations. These technological barriers require significantly reducing the qubit count that is required for error correction, while maintaining computational fault-tolerance.

The ratio of physical qubits to logical qubits is roughly 1000:1. This redundancy of physical qubits is required for logical computation to run algorithms on every known architecture. Topological surface codes have not been demonstrated for more than one logical qubit.

The data bus reduces the number of qubits necessary for error correction by three orders of magnitude by eliminating resource hungry ancillary regions of the encoded computer. This is of practical interest for those interested in running quantum chemistry algorithms. The data bus transforms all layers of the quantum computing stack (e.g. as envisioned by Google, IBM, Intel, Microsoft, Riggeti) from the high-level quantum algorithm to the lowest level's chip designs. It can be applied to any hardware and is independent of platform.

The data bus improves resource counts in two critical areas of quantum computing development:
1) Interaction of two surface code patches on NISQ machines.
2) Large-scale circuits with a structure similar to state-of-the-art quantum chemistry circuits.

Further details and features of embodiments of the present disclosure are described below with reference to the figures of preferred exemplary embodiments. These are only intended to illustrate the various embodiments, and in no way to limit them.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

Figure 1:
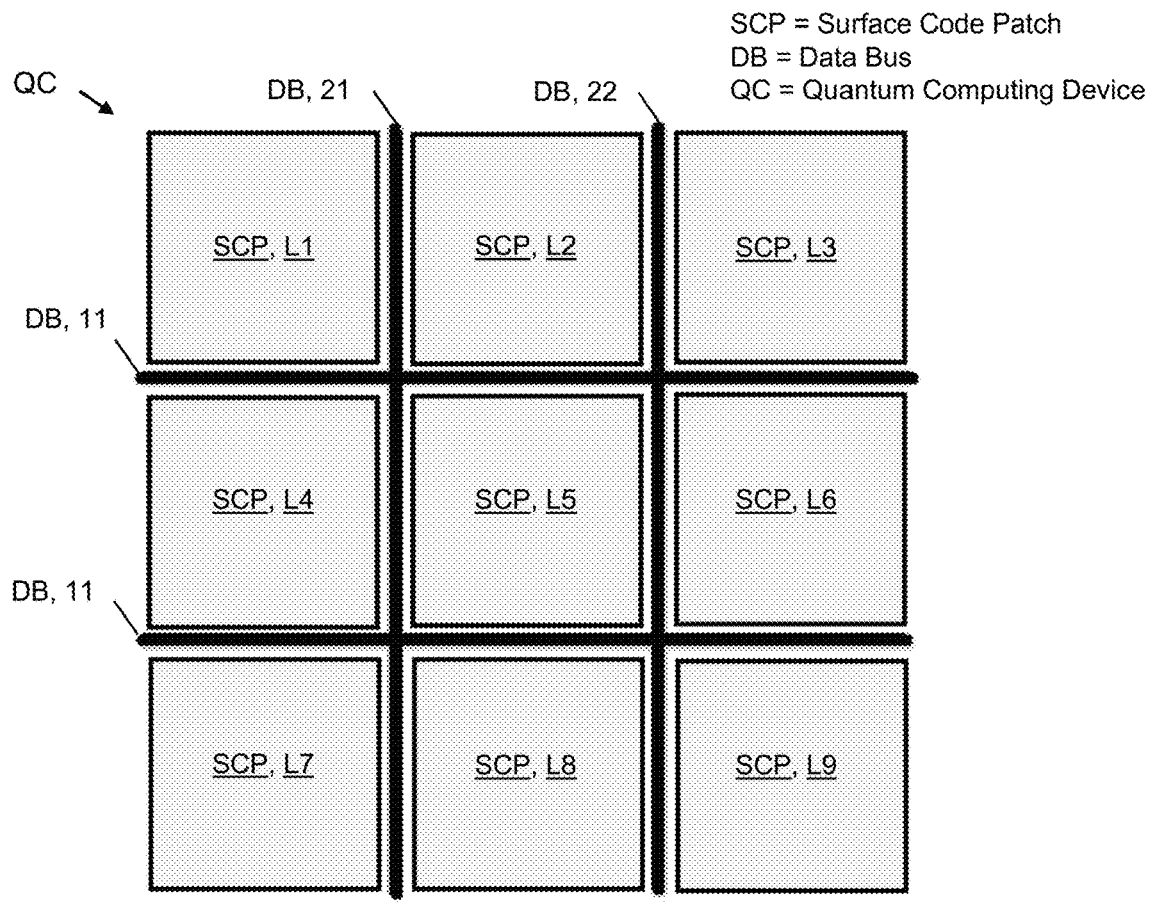
FIG. 1 is an exemplary embodiment of the quantum computing device of the invention comprising a 3×3 array of surface code patches connected by two horizontal and two vertical data bus patches of qubits.

In the following, illustrative embodiments of the device and the method for performing quantum computing according to this invention are presented.

In the figures, the same reference numerals are used also for different embodiments to denote features of corresponding function or meaning.

An embodiment of the quantum computing device according to the invention is shown in FIG. 1. The hollow squares SCP represent planar- or surface code patches encoding logical qubits 101-109 and the black lines DB between represent rectangular patches of qubits making up the data bus connecting the square surface code patches and thus enabling two-qubit operations between the logical qubits.

This allows effective all-to-all connectivity between the logical qubits 101-109 where logical operators are stored on patches of planar code surrounded by a single string of repetition code.

The grid between different planar code patches making up the data bus can have a thickness of only a single qubit. This is in stark contrast to the thickness of ancilla patches of the state of the art, where the thickness is given by the distance d of the surface code. Thus in contrast to the state of the art, the quantum computing device of the invention advantageously reduces the overhead of physical qubits required. Contrasting a lattice, where the thickness of the data bus patches equals d, to one where the thickness is only a single qubit, the reduction in the number of physical qubits approaches 75% in the limit of large d. However, this does not take into account the fact that the quantum computing device of the present invention has more stringent error correction requirements due to the time overhead incurred by moving to a data bus with widths less than d. This necessitates moving to surface codes with larger distances d for a given desired level of confidence, i.e. likelihood of error in the final result. However, even taking this partial offset into account, there remains a net benefit. That is to say, while the time penalty associated with using the data bus requires a larger d than if it is not used and a larger d means that all logical qubits in the computer actually require more physical qubits as the size of a logical qubit when using the data bus (in terms of physical qubits) is larger, because all the physical qubits needed for ancillary patches are eliminated when using the data bus, there is still an overall savings in physical qubits for the entire computer.

Figure 2A:
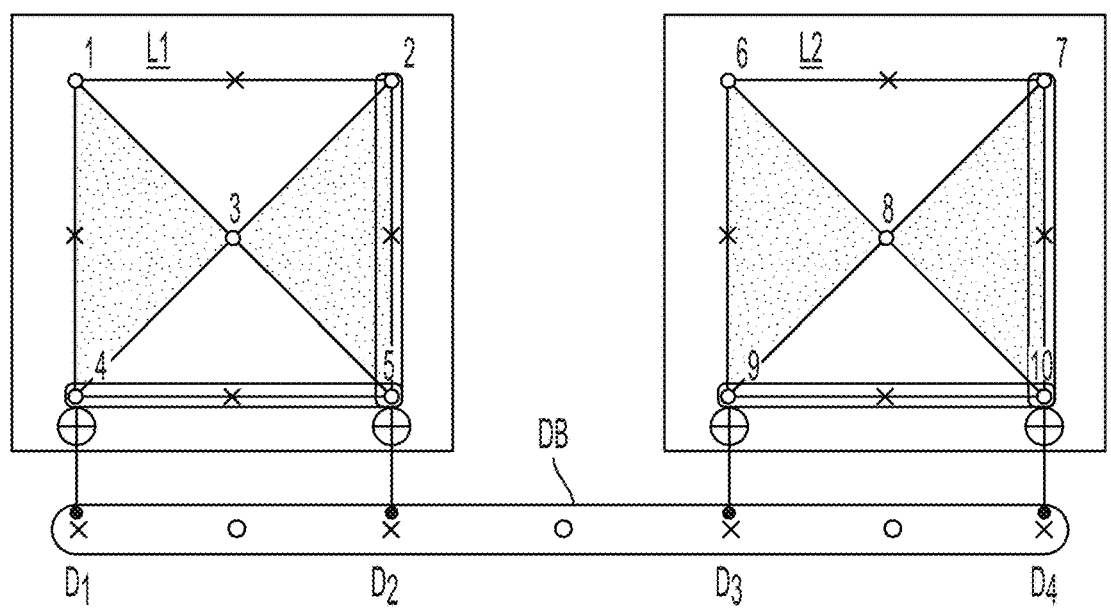
FIG. 2A is an illustration of an XX-parity check implementing a merge operation in an embodiment of the invention employing surface code patches with a distance of d=2.
Figures 2B, 3:
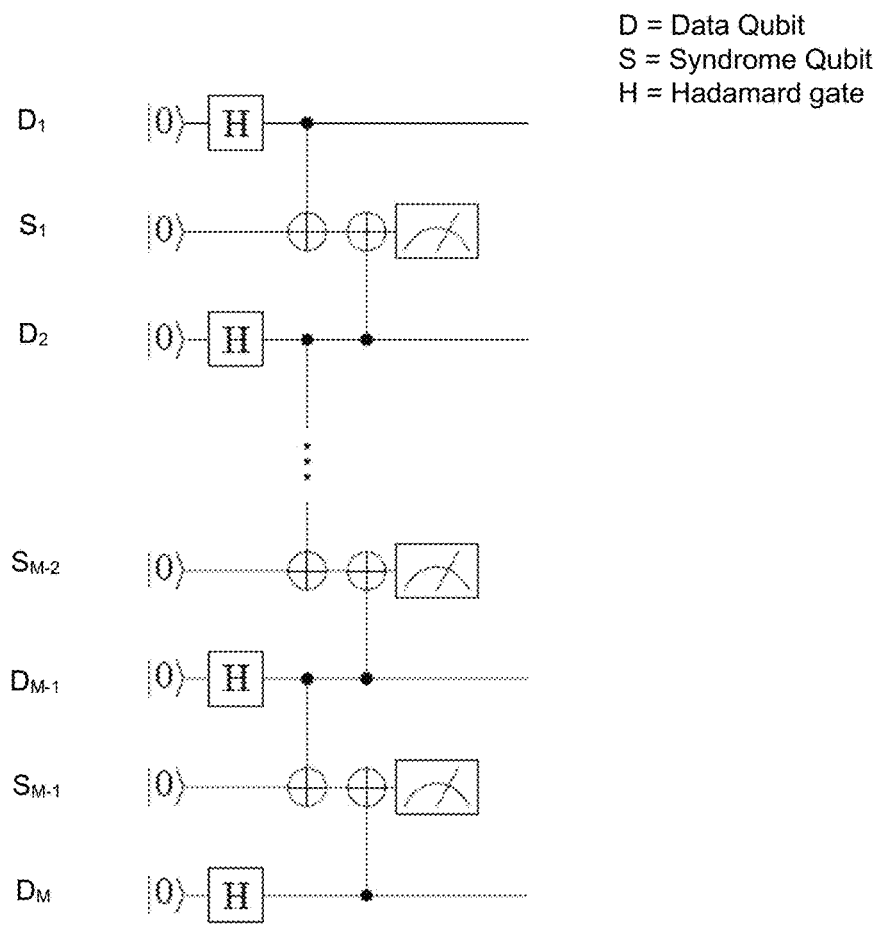
FIG. 2B is an example of a stabilizer table for the embodiment illustrated in FIG. 2A.
FIG. 3 is a diagram of a circuit for preparing a set of data bus qubits of a quantum computing device according to embodiments of the invention in a GHZ state usable in a parity check measurement.

An embodiment of the method for performing a parity check between two logical qubits connected by a rectangular patch of qubits serving as a data bus is now presented with reference to FIGS. 2A and 2B.

FIG. 2A shows two surface code patches L1, L2 of distance d=2, i.e. with 9 qubits each. The triangular areas represent stabilizers. X-stabilizers are illustrated by horizontal, Z-stabilizers by vertical hatching. Data qubits 1-10 of the planar code patches are given by dots and syndrome qubits are given by crosses. Logical X and logical Z operators are represented by the horizontal and vertical bars respectively. A data bus DB of N=7 qubits in a chain, the four data qubits D1-D4 separated from each other by three syndrome qubits, connects the two square surface code patches. For the data bus qubits, the meaning of syndrome and data qubits is flipped compared to the logical qubits, i.e. crosses are the data qubits D1-D4 and dots the syndrome qubits of the data bus DB.

The sequence of steps to perform an error corrected XX-parity measurement implementing a merge operation is as follows:

1) Prepare the N=7 qubits of the data bus DB in a GHZ state, e.g. by using the circuit of FIG. 3, and preferably including a d-cycles of error correction;
2) Perform transversal CNOT operations between adjacent, i.e. nearest neighbor data qubits D1-D4 of the data bus DB and the two surface code patches. As illustrated in FIG. 2A, the control qubits of these CNOTs are the data qubits D1-D4 of the data bus DB, while the targets are the data qubits (4, 5, 9, 10) of the code patches. These CNOT operations are preferably performed simultaneously;
3) Without measuring any further stabilizers, measure all data qubits D1-D4 of the data bus DB, i.e. all data bus qubits represented by an 'X" in FIG. 2A, in the x-basis;
4) Repeat steps 1-3 d-times;
5) Apply a majority vote to the measurement results of step d to obtain the error corrected measurement result of the XX-parity measurement.—

In the example, a distance of d=2 is shown, but arbitrary distances can be used. The value d=2 allows the smallest implementations in terms of number of qubits, but like all other even distances, there is the downside that a split vote may occur in step 5. The fact that the vote may be split for d=2 and potentially for d=4, 6, 8 etc. reflects the fact that for even distance the surface code is not a deterministic corrector of (d−1)/2 errors. For odd d we should always be able to detect and correct (d−1)/2 errors. There is always a clear majority vote for odd d.

For the original layout of two neighboring logical qubits in a square array, between which a merge-operation is to be performed, as illustrated in FIG. 2A, without the data bus, the total qubit count is 77. By using the data bus the qubit count is reduced to the 28 qubits shown in FIG. 2A.

This is sufficient for implementation on new qubit chipsets. For large-scale computation, the routing often comprises one-third of the number of qubits for a circuit. For large volumes, numerical evidence points to an apparent net benefit of the application of a data bus on the order of 15% or more.

The procedure is now described in more detail. In the first step an N-qubit GHZ-state has been prepared and its errors have been corrected. In the example in FIG. 2A, N=4 corresponding to the four data qubits of the data bus. For general N, we can assume that the state is given by:

$$|\psi\rangle = |00\ldots0\rangle + |11\ldots1\rangle$$

This state can be expressed in the x-basis:

$$|\psi\rangle = \frac{1}{\sqrt{N}} \sum_{\substack{s \in \{+,-\}^N, \\ \text{even no. of } - \text{ in } s}} |s\rangle$$

This means that the total parity of the GHZ-state is even in the x-basis. It also means that the total parity of this repetition code does not change under the application of any even number of physical Z-operations on the data qubits.

FIG. 2A shows how individual patches of logical qubits are connected to this data bus that supports Z-parity checks. The CNOTs are applied on a chain of qubits that correspond to the logical X-operator of the individual surface code patches which neighbors the data bus. Each of the patches will add an odd number of Z operations to the GHZ-state if they are in the |−⟩ state and thus flip the total parity (to flip the state from |+⟩ to |−⟩ a logical Z operation needs to be applied). If a data qubit of one of the surface code patches is in the |+⟩ state the total parity will not be changed. During the third step of the procedure according to this embodiment, a measurement in the x-basis of each individual qubit of the GHZ-state will result in the total parity of all logical qubits. The exact operation can also be seen on an example of a stabilizer table shown in FIG. 2B, where the changes due to the CNOTs are highlighted by circles.

The row with the four circled X operators is particularly interesting because this is a product of the total parity of the GHZ-state in X-basis with the XX parity of both patches. The total parity of this stabilizer is even. Therefore, one is able to deduce the logical XX measurement by a measurement of the parity of the GHZ-state.

FIG. 2A illustrates an XX-parity check. However, for a ZZ-parity check the same general procedure can be performed with the exception of the GHZ-state being initialized in the x-basis instead of the z-basis: $|\psi\rangle = |++\ldots+\rangle+|--\ldots-\rangle$, the CNOTs needing to connect this x-basis GHZ-state with the logical Z-operator chain, the CNOTs being inverted (target qubits of the CNOTs are the data qubits of the bus) and the final measurement needs to be in the Z-basis for the ZZ-parity check.

The strength of the error correction of this scheme is now derived from the example of the XX parity-check presented before and illustrated in FIGS. 2A and 2B.

The main ingredient is the error corrected N-qubit GHZ-state. The circuit in FIG. 3 creates the GHZ-state along a line of qubits where each second qubit is a syndrome qubit that can detect a change in ZZ-parity of its neighbors. Each stabilizer measurement is repeated d times to correct for measurement errors. After the GHZ-state has been created and verified, a transversal CNOT between the surface-code patches and the GHZ-state can be performed. Immediately afterwards, the data qubits of the GHZ-state are measured. Because this measurement is not protected, it has to be repeated d times.

The measurement will collapse the state into one of two subspaces. One subspace has an even number of Pauli-X errors. The protected quantity of interest is the total parity along the data bus. An even number of errors does not influence the total result. The probability of this happening is given by $$P_{even} = N \sum_{i=0}^{\infty} p_{phys}^{2i}$$

where N is a normalization factor to ensure that the probabilities of all odd and even outcomes sum to 1.

The other sub-space has an odd number of errors and results in the wrong logical result. The probability for such an event is given by:

$$P_{odd} = N \sum_{i=0}^{\infty} p_{phys}^{2i+1} = N p_{phys} P_{even}$$

The odd subspace which results in a wrong measurement is less likely by a factor of $p_{phys}$ and repeated measurements can be performed for better protection against errors. For an N-qubit GHZ-state N measurements are needed. The majority of the measurement results will give the error-protected result of the parity between the two patches.

FIG. 3 is an illustration of a circuit which may be used to prepare the data qubits of the rectangular data bus qubit patch connecting two surface code patches of a quantum computing device according to the invention in a GHZ state.

The qubits D1, D2, DM-1 and DM are the data qubits, which alternate with the syndrome qubits s1, sM-2 and sM-1. Here the number N of qubits in the data bus qubit patch is given by N=2M+1. The left-right axis represents time with operations performed at a later time lying to the right. The ellipsis signifies that in the complete circuit the elements shown are repeated in the same fashion.

As shown all qubits are initialized in the state |0>. Then a Hadamard gate H is performed on the data qubits, changing each of their single qubit states to |+>+|-> (without normalization).

Then each syndrome qubit k is the target of two CNOT controlled by its respective neighboring data qubits k and k+1. Shown in FIG. 3 are two CNOTs controlled by data qubits 1 and 2 acting on syndrome qubits S1, two CNOTs controlled by data qubits M-2 and M-1 acting on syndrome qubits SM-2 and two CNOTs controlled by data qubits M-1 and M acting on syndrome qubits SM-1. The syndrome qubits are then measured repeatedly d times where d is the distance of the surface code patches that are to be connected by the data bus.

Although the embodiments of the present disclosure have been described with reference to preferred embodiments, those skilled in the art will recognize that changes may be made in form and detail without departing from the spirit and scope of the present disclosure. The foregoing embodiments are therefore to be considered in all respects illustrative rather than limiting of the subject matter described herein.

Comprise, include, and/or plural forms of each are open-ended and include the listed parts and can include additional parts that are not listed. And/or is open-ended and includes one or more of the listed parts and combinations of the listed parts.

LIST OF REFERENCE CHARACTERS

QC quantum computing device
DB data bus
SCP surface code patch encoding a logical qubit
L1-L9 logical qubits
1-10 data qubits of the surface code patches
$D_1$-$D_M$ data qubits of the data bus
$D_1$-$D_{M-1}$ syndrome qubits of the data bus

The invention claimed is:

1. A quantum computing device comprising:
two or more logical qubits each consisting of a square patch of (d+1)×(d+1) qubits in a joint quantum state corresponding to a surface code, the qubits of each square patch being classified as either data qubits or syndrome qubits and the surface code having a distance d of two or more,
one or more rectangular patches of N×m qubits serving as a data bus with a length N>=2 and a width m>=1, the qubits of the data bus being in a joint quantum state,
wherein the data bus connects the first and the second square patch of qubits in that each of the two or more square patches of qubits contains a qubit that is adjacent to a qubit of the data bus, wherein two qubits are adjacent if there are means for performing two qubit CNOT operations between them.

2. The device of claim 1, wherein there are three or more logical qubits.

3. The device of claim 2, wherein one of the one or more data buses connects more than two logical qubits.

4. The device of claim 2, wherein the data bus connects all logical qubits.

5. The device of claim 1, wherein there is more than one data bus.

6. The device of claim 1, wherein the distance d of the surface code is greater than two.

7. The device of claim 1, wherein the four or more square patches of qubits are arranged into an array.

8. The device of claim 1, wherein the width m of the data bus is m=1.

9. The device of claim 8, wherein the length N of the data bus is greater or equal to the sum of the side lengths of the square qubit patches encoding the logical qubits, i.e. N>=2(d+1).

10. The device of claim 9, wherein the N qubits of the data bus are in a joint GHZ-state.

11. A method for implementing a merge operation by performing an arbitrary length fault tolerant parity check in surface code quantum computing comprising:

a) preparing a first and a second logical qubit each in the form of square patch of qubits in a joint quantum state corresponding to a surface code with distance d, the square patches of qubits each having a side-length of (d+1) qubits, the qubits of the square patches being classified as either data qubits or syndrome qubits, b) preparing a chain of N data bus qubits with N>=2 in a joint GHZ-state, wherein the chain of data qubits connects the first and second logical qubit in that each of the logical qubits contains one or more data qubits that is adjacent to a qubit of the data bus, c) for each data qubit of the first and second logical qubit adjacent to a data bus qubit, performing a transversal CNOT operation between that data qubit and the qubit of the data bus to which it is adjacent, d) measuring all qubits of the data bus, e) repeating steps b)-d) d times, and f) obtaining an error corrected measurement result by a majority vote over the individual measurement results of step d).

12. The method of claim 11, wherein during step b the qubits of the data bus are kept protected against bit flip errors.

13. The method of claim 12, wherein the qubits of the data bus are kept protected against bit flip errors by performing d cycles of error correction.

14. The method of claim 11, wherein at least two CNOT operations are performed simultaneously.

15. The method of claim 14, wherein all CNOT operations are performed simultaneously.

* * * * *